United States Patent [19]

Kiess et al.

[11] 4,319,284

[45] Mar. 9, 1982

[54] REPETITIVE READOUT OF ELECTROSTATICALLY STORED INFORMATION

[75] Inventors: Helmut G. Kiess, Niedersteinmaur; Bruno K. Binggeli, Rueti, both of Switzerland

[73] Assignee: RCA Corporation, New York, N.Y.

[21] Appl. No.: 84,413

[22] Filed: Oct. 12, 1979

[51] Int. Cl.³ .............................................. H04N 1/02
[52] U.S. Cl. ..................................... 358/294; 357/30; 358/213; 365/237
[58] Field of Search ............... 365/234, 237; 358/212, 358/213, 294; 357/30; 250/211 J

[56] References Cited

U.S. PATENT DOCUMENTS

| 3,344,278 | 9/1967 | Yanai | 250/211 |
| 3,458,689 | 7/1969 | Lynch | 235/61.11 |
| 3,770,968 | 11/1973 | Hession et al. | 250/211 J |
| 3,774,168 | 11/1973 | Koo et al. | 365/237 |
| 3,904,818 | 9/1975 | Kovac | 358/213 |
| 4,145,721 | 3/1979 | Beaudoin et al. | 357/30 |

*Primary Examiner*—Joseph A. Orsino, Jr.
*Attorney, Agent, or Firm*—Samuel Cohen; George J. Seligsohn

[57] ABSTRACT

Apparatus for continuously reading out the graphic information represented by a charge pattern on a dielectric film includes an integrated circuit array of field effect devices each having a source and drain in series with a respective p-n junction photodiodes. A bias voltage is connected across the field effect devices and respective photodiodes and a load impedance. A scanner positioned to scan a spot of light over the array of photodiodes causes conduction of currents through field effect devices which are rendered conductive by charges on the dielectric film to produce a video signal across the load impedance.

4 Claims, 4 Drawing Figures

REPETITIVE READOUT OF ELECTROSTATICALLY STORED INFORMATION

This invention relates to electrophotography, and more particularly to apparatus for repetitively producing a video electrical signal from a charge pattern representing an image on an insulating sheet.

Graphic information can be stored in form of electrostatic charge patterns on highly insulating films such as "Mylar" (polyethylenteraphthalate), "Makrofol" (polycarbonate), etc., for long periods of time. The information can be read nondestructively by capacitively scanning the film with a metal oxide semiconductor (MOS) device. However, high mechanical precision of the moving parts is required since a change in distance from the sensor to the surface of the film by only a few microns gives a change of the induced charge on the MOS device causing unwanted signals and distortions of the information. Therefore a different method is needed which avoids the expensive high precision mechanics of a mechanical scanning apparatus.

Graphic information can be put onto highly insulating sheets or films using a fine probe to which an electrical signal is applied. Charge is then transferred to the surface of the film in correspondence to the applied voltage and the capacitance of the film. The deposited charge patterns stay on the surface of the insulator for at least several months. Similarly, latent images obtained in the electrophotographic process can be transferred to insulating films in a manner described in U.S. patent application Ser. No. 778,593 filed on Mar. 17, 1977, and now abandoned, for a "Method of Performing High-Sensitivity Electrophotography" by the same inventor and assignee as the present application. In the electrophotographic process, the insulating film preferably has a thicknes of $10\mu$ and the latent image on the film is stored in form of a monopolar or dipolar charge pattern. A lower limit of the charge densities of latent images lies in between $10^{-9}$ to $10^{-10}$ Asec/cm$^2$. If the size of the picture element is assumed to be $10\ \mu m \times 10\ \mu m$, the charge to be measured amounts to $\sim 10^{-15}$ Asec. It is desirable to be able to read out charge patterns of this and higher values. The readout is more easily accomplished when the charge densities are higher and/or a lower resolution is acceptable.

An improved method of readout of a graphic charge pattern without destroying it is described in allowed patent application Ser. No. 085,394, filed on Oct. 12, 1979 by H. G. Kiess, et al. entitled "Readout of Electrostatically Stored Information" and assigned to the assignee of the present application. In the method, an electrical signal representing a charge pattern on an insulating dielectric sheet or film is produced by the steps of: placing the film having the charge pattern in close contact with the free surface of an uncharged photoconductor having a back electrode, placing a transparent electrode on the free surface of the film, connecting a signal output impedance between the back electrode and the transparent electrode, and scanning the photoconductor through the transparent electrode and the dielectric film with a flying spot of light to produce an electrical signal across the impedance during the scanning. This method is especially useful in applications where an image is read out only once, e.g., in the case of moving pictures where each frame is read out only once.

A charge pattern image on an insulating dielectric film can be read out repetitively by an apparatus according to an example of the present invention in which the film is placed on an integrated circuit array of field effect devices, each connected in circuit with a photodiode. All the field effect devices and respective photodiodes in parallel are connected in circuit with an electric bias source and an output load resistor. The photodiodes are scanned with a spot of light in line-by-line fashion to produce an electric video signal across the load resistor.

Figure 1:
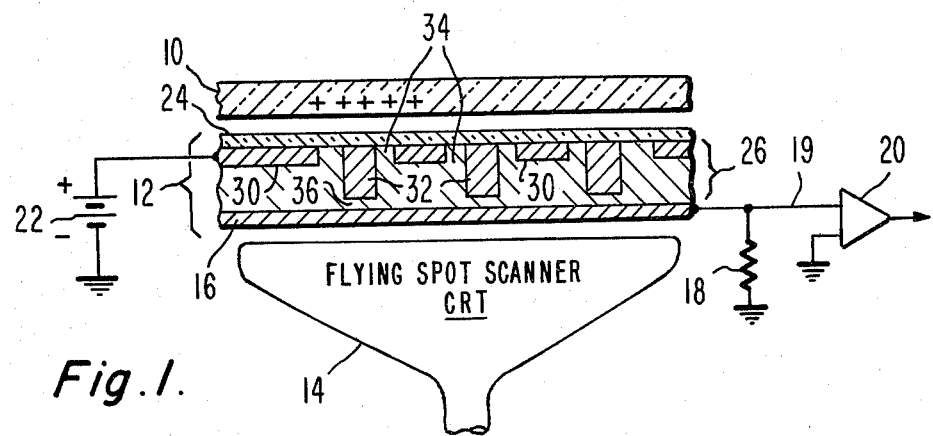
FIG. 1 is a sectional view showing apparatus for repetitively reading out a charge pattern on a dielectric film.
Figure 2:
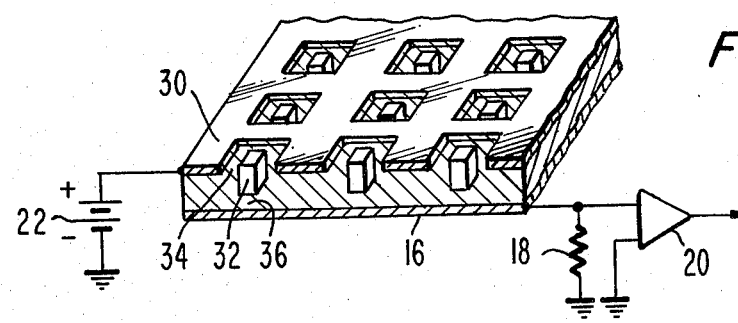
FIG. 2 is a perspective view of a portion of the integrated circuit unit in FIG. 1.
Figure 3:
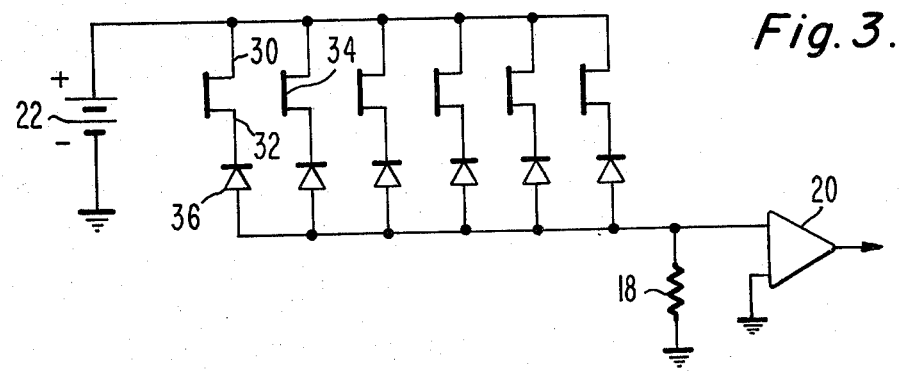
FIG. 3 is a schematic circuit diagram of the integrated circuit unit and elements connected thereto.

Reference is now made in greater detail to FIGS. 1 through 3 for a description of apparatus by which a latent charge pattern image on a dielectric film can be read out in the form of an electrical video signal suitable for use in displaying the image on a cathode-ray-tube display unit (not shown). FIG. 1 shows apparatus including a dielectric film 10 having an image charge pattern thereon, an integrated circuit unit 12 including an array of field effect devices and photodiodes, and a flying spot scanner 14 for scanning a spot of light in line-by-line fashion across the photodiodes in unit 12. The scanner may include an optical system (not shown) and may be any other known type of scanner for moving a spot of light in line-by-line fashion across the bottom surface of the unit 12.

The dielectric film 10 is made of a material such as "Mylar" (trademark of E. I. Dupont Company, Wilmington, Del.,) or "Makrofol" (trademark of Bayer AG, Leverkusen, West Germany). The film 10 may have a thickness of 10 micrometers. The film 10 has a latent charge pattern thereon represented by positive charges (+). The charge pattern is delimited by the surrounding areas which are free of charges.

The film 10, with its charge pattern, is positioned with its bottom surface in close contact with the free insulating upper surface of the integrated circuit unit 12 having an ohmic back electrode 16 on the bottom surface thereof. The ohmic back conductor 16 is connected through a load resistor 18 to ground or point of reference potential, and is connected over a path 19 to an amplifier 20. A bias or operating voltage source shown as a battery 22 is connected to the unit 12 to complete an electrical circuit shown schematically in FIG. 3.

The integrated circuit unit 12 includes an insulating layer 24 of silicon dioxide, aluminum oxide, or silicon nitride having a thickness up to a few microns. The insulating layer is on a wafer 26 of P-type semiconductor material in which N-type source region 30 and N-type drain regions 32 are formed by diffusion using well-known integrated circuit semiconductor manufacturing technology. The source region 30 cooperates with the drain regions 32, and channel regions 34 therebetween, to form an array of field effect devices. The devices can be considered to be field effect transistors in which the insulating layer 24 is the gate insulator or dielectric. The gate voltage applied to each of the channel regions 34 of a transistor is a voltage due to an elemental part of the image charge pattern on the dielectric film 10.

The drain regions 32 extend down close to the ohmic contact 16, so that the transition region of the drain 32 to the P-type silicon semiconductor is located close to the ohmic contact. This transition region 36, being a p-n junction, constitutes a diode which is in series with the respective field effect device 30, 32, 34, as shown in FIG. 3. The described construction is such that when light is directed from the bottom through the ohmic contact 16 into the wafer 26, the p-n junction at 36 becomes conducting, but almost all the light is absorbed in the wafer before it reaches the p-n junction at 34 near the source 30.

The transconductance of a MOS field effect device is of the order of $10^{-7}$ ohms$^{-1}$ and the current is about $10^{-7}$ amperes if a charge of $10^{-15}$ Cb (ampere seconds) is put on the gate of the MOS. (A charge of $10^{-15}$ Cb was assumed since the charge densities in low voltage electrophotography are of the order of $10^{-9}$ Cb/cm$^2$, hence a picture element of $10\mu \times 10\mu$ carries a charge of $\sim 10^{-15}$ Cb. This value represents a lower limit). Therefore the diode must have a resistance in rest position of about two orders in magnitude greater than $10^7 \Omega$ to prevent current flow, and, in on position about 100 times smaller than $10^7 \Omega$. The decrease in resistance of the diode can be achieved with a photon flux of the order of $10^{14}$ photons/sec. These light intensities are available from flying spot tubes, light emitting diodes, etc. When an array of $500 \times 500$ of these devices is used, a stray capacitance of about $10^{-8}$ F is calculated. Hence, envisaging a scanning speed of $10^6$ Hz, the load resistor 18 should be below 100 $\Omega$. The voltage across the load resistor is then several microvolts.

Figure 4:
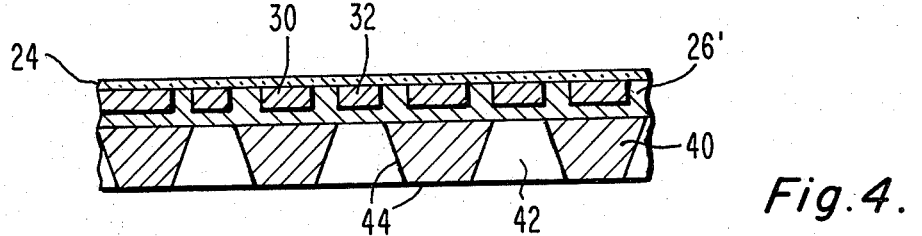
FIG. 4 is a sectional view of an alternative integrated circuit unit.

FIG. 4 shows an alternative construction in which the silicon wafer 26' is grown on sapphire 40 which is provided with holes 42 under the drain regions 32. The surface of the sapphire 40 is metallized at 44 to provide an ohmic contact to the silicon 26', and to prevent scanning light from reaching the p-n junction near the source regions 30.

In the operation of the apparatus of FIG. 1, a dielectric film 10, having a charge pattern thereon representing an image, is placed in close contact with the insulating layer 24 on the top surface of the integrated circuit unit 12. The source regions 30 of the unit 12 are connected to a source 22 of bias or operating potential referenced to ground. The ohmic contact 16 at the bottom of the unit 12 is connected to an output load impedance 18 reference to ground and to an amplifier 20. The source regions 30, drain regions 32 and channel regions 34 constitute field effect transistors arranged in an array. The conductivity of each transistor is determined by the presence or absence of positive charges in the dielectric film 10 immediately adjacent each transistor. In FIG. 1, the positive charges shown in film 10 cause the adjacent field effect transistor to present a low impedance to the flow of current from bias source 22 to source region 30 and through channel region 34 to the adjacent drain region 32. But current does not flow from the drain region to the ohmic contact 16 and through the load impedance 18 because of the high impedance at 36 of the p-n junction photodiode. However, when the photodiode 36 is illuminated by a spot of light from the flying spot scanner 14, the diode is rendered conductive to conduct a current, proportional to the elemental charge in film 10, through the load impedance 18. The developed electrical signal is amplified at 20 and is a video signal always representing the intensity of an elemental part of the charge image in film 10 as the unit 12 is scanned in line-by-line fashion by a spot of light from scanner 14. The electrical signal can be applied to a CRT display unit having a deflection system synchronized with the deflection system of the flying spot scanner 14. Or, the electrical signal can be recorded on magnetic tape and applied at a later time to a CRT display unit.

The operation of the apparatus of FIG. 1 in reading out the charge image pattern in film 10 does not result in a discharging of the film 10. Therefore, the flying spot scanner can be operated to repetitively scan the entire area of the unit 12, and the output video signal can be used to repetitively reproduce the image on the film 10 for any desired period of time without having to replicate or refresh the charge pattern image in film 10.

What is claimed is:

1. In an apparatus for continuously reading out the graphic information represented by a charge pattern on a dielectric film,
   an integrated circuit having an array of field effect devices each comprising source and drain regions of one conductivity type separated by a channel region of the opposite conductivity type at one face of said integrated circuit which is to be positioned adjacent said dielectric film, and having an array of p-n junction photodiodes each in serial circuit with a respective drain electrode and located between the opposite face of said integrated circuit and said respective drain electrode, and having a transparent electrode on said opposite face of the integrated circuit,
   a load impedance connected to said transparent electrode, and
   means to supply an operating bias voltage across said field effect devices and respective photodiodes and said load impedance.

2. Apparatus for continuously reading out the graphic information represented by a charge pattern on a dielectric film, comprising
   an array of field effect devices each in series with a respective photodiode,
   means to supply a bias voltage across said field effect devices and respective photodiodes and a load impedance, and
   a scanner positioned to scan a spot of light over said array of photodiodes in line-by-line fashion to render said photodiodes sequentially conductive,
   whereby to conduct currents from field effect devices which are rendered conductive by charges on said dielectric film through said load impedance to produce a video signal thereacross.

3. Apparatus for continuously reading out the graphic information represented by a charge pattern on a dielectric film, comprising
   an integrated circuit having an array of field effect devices each comprising source and drain regions of one conductivity type separated by a channel region of the opposite conductivity at one face of said integrated circuit which is positioned adjacent said dielectric film, and having an array of p-n junction photodiodes each in serial circuit with a respective drain electrode and located between the opposite face of said integrated circuit and said respective drain electrode, and having a transparent electrode on said opposite face of the integrated circuit,
   a load impedance connected to said transparent electrode, means to supply a bias voltage across said field effect devices and respective photodiodes and said load impedance, and a scanner positioned to scan a spot of light over said opposite face of the integrated circuit in line-by-line fashion to render said photodiodes sequentially conductive, whereby to conduct current from field effect devices which are rendered conductive by charges on said dielectric film through said load impedance to produce a video signal thereacross.

4. Apparatus for non-destructively reading a charge pattern from a storage medium comprising, in combination:

an area array of transistors, adapted to be positioned adjacent to said storage medium, each such transistor including a pair of electrodes, a conduction path between said electrodes, and a dielectric region for insulating the conduction path from the storage medium, the conductivity of said conduction path of each transistor being responsive to the magnitude of charge in the portion of the storage medium adjacent to said conduction path of that transistor and separated therefrom by said dielectric region;

a common load;

a plurality of normally-open, light-responsive switches, each said switch in series with the conduction path of a different transistor, all of said switches connected at one terminal to one terminal of said common load and at its other terminal to an electrode of a transistor;

a source of operating potential connected at one terminal to the other terminal of said common load and at its other terminal to the other electrode of all of said transistors; and means for successively closing and then opening each switch, comprising means for applying a spot of light in a scan pattern to said switches, to thereby produce, across said load, successive voltages indicative of the charge pattern.

* * * * *